(12) United States Patent
Kovac et al.

(10) Patent No.: US 12,489,403 B2
(45) Date of Patent: Dec. 2, 2025

(54) CASCODE GAIN BOOSTING AND LINEAR GAIN CONTROL USING GATE RESISTOR

(71) Applicant: pSemi Corporation, San Diego, CA (US)

(72) Inventors: David Kovac, Arlington Heights, IL (US); Joseph Golat, Crystal Lake, IL (US)

(73) Assignee: pSemi Corporation, San Diego, CA (US)

( * ) Notice: Subject to any disclaimer, the term of this patent is extended or adjusted under 35 U.S.C. 154(b) by 162 days.

(21) Appl. No.: 18/458,368

(22) Filed: Aug. 30, 2023

(65) Prior Publication Data

US 2024/0113664 A1   Apr. 4, 2024

Related U.S. Application Data

(63) Continuation of application No. 17/933,340, filed on Sep. 19, 2022, now Pat. No. 11,777,451, which is a
(Continued)

(51) Int. Cl.
*H03F 1/22* (2006.01)
*H03F 1/56* (2006.01)
(Continued)

(52) U.S. Cl.
CPC ............ *H03F 1/223* (2013.01); *H03F 1/565* (2013.01); *H03F 3/195* (2013.01); *H03F 3/72* (2013.01);
(Continued)

(58) Field of Classification Search
CPC ....................................................... H03F 1/22
(Continued)

(56) References Cited

U.S. PATENT DOCUMENTS 7,248,120 B2 * 7/2007 Burgener ............... H01Q 23/00
330/277
7,839,219 B2   11/2010 Kuo et al.
(Continued)

OTHER PUBLICATIONS

Kim, J., et al., "Suppression of IMD3 in CMOS Power Amplifier Using Bias Circuit of Common-Gate Transistor with Cascade Structure," *Progress In Electromagnetics Research M*, vol. 82, 1-8, 2019. 8 Pages.
(Continued)

*Primary Examiner* — Henry Choe
(74) *Attorney, Agent, or Firm* — Steinfl + Bruno LLP

(57) ABSTRACT

Methods and apparatuses for controlling gain of a single stage cascode FET amplifier are presented. According to one aspect, a series-connected resistor and capacitor is coupled to a gate of a cascode FET transistor of the amplifier, the capacitor providing a short at frequencies of operation of the amplifier. According to another aspect, values of the resistor can be used to control gain of the amplifier. According to yet another aspect, the resistor is a variable resistor whose value can be controlled/adjusted to provide different gains of the amplifier according to a linear function of the resistor value. An input matching network coupled to an input of the amplifier can be used to compensate for different noise figure degradations from different values of the resistor.

24 Claims, 12 Drawing Sheets

Related U.S. Application Data continuation of application No. 16/928,722, filed on Jul. 14, 2020, now Pat. No. 11,489,495.

(51) Int. Cl.
  *H03F 3/195* (2006.01)
  *H03F 3/72* (2006.01)

(52) U.S. Cl.
  CPC .. *H03F 2200/294* (2013.01); *H03F 2200/381* (2013.01); *H03F 2200/451* (2013.01)

(58) Field of Classification Search
  USPC .................................................. 330/311, 310
  See application file for complete search history.

(56) References Cited

U.S. PATENT DOCUMENTS

| | | | | |
|---|---|---|---|---|
| 8,111,104 | B2* | 2/2012 | Ahadian | ................ H03F 1/223 |
| | | | | 330/311 |
| 8,427,241 | B2* | 4/2013 | Ezzeddine | ............ H03F 1/0205 |
| | | | | 330/311 |
| 8,779,859 | B2* | 7/2014 | Su | .......................... H03F 3/193 |
| | | | | 330/311 |
| 9,041,473 | B2* | 5/2015 | Fujiwara | ................ H03F 1/223 |
| | | | | 330/311 |
| 9,954,493 | B2 | 4/2018 | Seshita et al. | |
| 10,033,332 | B2 | 7/2018 | Seshita et al. | |
| 10,707,823 | B1 | 7/2020 | Seshita et al. | |
| 10,931,246 | B2 | 2/2021 | Seshita et al. | |
| 10,938,349 | B1 | 3/2021 | Ayranci et al. | |
| 11,025,205 | B2 | 6/2021 | Kuwata et al. | |
| 11,043,922 | B2 | 6/2021 | Watanabe | |
| 11,085,954 | B2 | 8/2021 | Ma et al. | |
| 11,177,782 | B2 | 11/2021 | Luo | |
| 11,329,611 | B2* | 5/2022 | Jiang | ...................... H03F 1/223 |
| 11,489,495 | B2 | 11/2022 | Kovac et al. | |
| 11,742,802 | B2* | 8/2023 | Wagh | ................... H03F 1/0261 |
| | | | | 330/296 |
| 11,777,451 | B2 | 10/2023 | Kovac et al. | |
| 2005/0285684 | A1* | 12/2005 | Burgener | ............... H03F 3/189 |
| | | | | 330/311 |
| 2006/0119435 | A1* | 6/2006 | Oh | ......................... H03F 3/191 |
| | | | | 330/311 |

OTHER PUBLICATIONS

Kim, Y., et al., "Analysis and Design of Millimeter-Wave Power Amplifier Using Stacked-FET Structure," IEEE Transactions On Microwave Theory And Techniques, vol. 63, No. Feb. 2, 2015. 12 pages.

Park, Y., et al., "X-to-K band Broadband Watt-level Power Amplifier Using Stacked-FET Unit Cells," IEEE Radio Frequency Integrated Circuits Symposium, Baltimore, MD, 2011, pp. 1-4, doi: 10.1109/RFIC.2011.5940620. 4 pages.

Van der Bent, G., et al., "Design Procedure for Integrated Microwave GaAs Stacked-FET High-Power Amplifiers," IEEE Transactions On Microwave Theory And Techniques, vol. 67, No. 9, Sep. 2019. 16 pages.

Yu, Y.H., et al., "A Compact Wideband CMOS Low Noise Amplifier With Gain Flatness Enhancement," IEEE Journal Of Solid-State Circuits, vol. 45, No. 3, Mar. 2010. 8 pages.

\* cited by examiner

100B

Prior Art

CASCODE GAIN BOOSTING AND LINEAR GAIN CONTROL USING GATE RESISTOR

CROSS REFERENCE TO RELATED APPLICATIONS

The present application is a continuation of U.S. Non-Provisional patent application Ser. No. 17/933,340 filed on Sep. 19, 2022, now U.S. Pat. No. 11,777,451 issued on Oct. 3, 2023 which, in turn, is a continuation of U.S. Non-Provisional patent application Ser. No. 16/928,722 filed on Jul. 14, 2020, now, U.S. Pat. No. 11,489,495 issued on Nov. 1, 2022, the contents of all of which are herein incorporated by reference in their entirety.

TECHNICAL FIELD

The present teachings relate to radio frequency (RF) circuits. More particularly, the present teachings relate to methods and apparatuses for controlling gain of a single stage cascode field-effect transistor (FET) amplifier.

BACKGROUND

FIG. 1A shows a simplified schematic of a prior art single stage cascode FET amplifier (100A) that can be used to amplify an RF signal, $RF_{IN}$, coupled to a gate, G1, of an input transistor, M1, of the amplifier (100A), and output a corresponding amplified RF signal, $RF_{OUT}$, into a load, $Z_L$, that may be coupled to a drain, D2, of an output (cascode) transistor, M2, of the amplifier (100A). DC biasing voltages (Vb1, Vb2) may be coupled to gates (G1, G2) of the cascode transistors (M1, M2) to provide operating points of the respective transistors as known to a person skilled in the art. As shown in FIG. 1A, the amplifier (100A) can operate between a supply voltage Vdd coupled to the drain, D2, of the output (cascode) transistor M2 via, for example, an inductor $L_{OUT}$, and a reference ground, Gnd, (e.g., AC ground) coupled to the source, S1, of the input transistor M1. As known to a person skilled in the art, the prior art amplifier (100A) can be referred to as a cascode amplifier having a single stage that is defined by the FET transistor M2 operating as a cascode transistor. Capacitors $C_{IN}$ and $C_{OUT}$ respectively coupled to the gate G1 of the transistors M1 and to the drain D2 of the transistor M2 may be used to decouple DC voltages from circuits coupled to input and output of the amplifier (100A).

With continued reference to the prior art amplifier (100A) shown in FIG. 1A, coupling of the source of the input transistor, M1, to the reference ground, Gnd, may be provided via a degeneration inductor, $L_{DEG}$, and coupling of the (input) RF signal, $RF_{IN}$, to the capacitor, $C_{IN}$, may be provided via an input inductor, $L_{IN}$. A person skilled in the art is well aware of such configuration and associated benefits, including benefits for input impedance matching as well as for a linearity performance and noise figure performance of the prior art amplifier (100A). In particular, such benefits make the configuration (100A) a design choice for implementations of, for example, low noise amplifiers (LNAs) used, for example, in receive paths of an RF communication system.

With continued reference to the prior art amplifier (100A) of FIG. 1A, a gate capacitor, Cg, may be coupled to the gate, G2, of the cascode transistor, M2. As known to a person skilled in the art, such gate capacitor, Cg, is sized to provide a short at frequencies of operation of the amplifier (100A). In other words, at frequencies of an RF signal being processed through the amplifier (100A) (e.g., $RF_{IN}$), an equivalent impedance of the gate capacitor, Cg, is close to zero, which effectively shorts the gate, G1, to Gnd. This can be achieved by sizing (i.e., selecting capacitance value of) the gate capacitor, Cg, to be large enough to present a very low impedance value at the frequencies of operation. In stark contrast, in amplifier applications where higher RF amplitudes may be processed (e.g., power amplifiers), it may be required to distribute the RF voltage at the output of the amplifier (e.g., $RF_{OUT}$), across the transistors (e.g., M1, M2) of the amplifier to protect each transistor from overvoltage. As known to a person skilled in the art, such overvoltage protection may be provided via sizing of the gate capacitor (e.g., Cg) to increase an impedance seen by the input transistor, M1, looking into the source, S2, of the cascode transistor, M2. Accordingly such sizing provides an equivalent impedance of the gate capacitor, Cg, which would not short the gate, G2, at the frequencies of operation. Embodiments according to the present application relate to single stage cascode amplifiers, such as one shown in FIG. 1A, with the gate capacitor, Cg, sized to provide a short at frequencies of operation of the amplifier. As described above, such applications include low noise amplifiers (LNAs).

As known to a person skilled in the art, the cascode configuration of the prior art amplifier (100A) shown in FIG. 1A can provide an increase of gain by increasing output impedance ($R_O$) and transconductance ($g_m$) of the transistor M1, when compared to a configuration without cascode (e.g., only input transistor M1). In cases where even more gain is required, the number of cascode stages can be increased as shown in the prior art configuration (100B) of FIG. 1B wherein a number (n−1) of cascode stages are used (with n>2). Alternatively, more gain can be provided via two similar amplifiers (e.g., 100A) arranged in cascade (e.g., series connected). However, such configurations for provision of higher gain may result in current drain and linearity degradations that may not be acceptable in low noise amplification (LNA) applications.

Such requirement for more gain in a receive path of an RF communication system may be associated, for example, with the advent of newer communication technologies, such as, for example, 5G communication, which may require operation not only at higher frequencies (e.g., 4-5 GHz and beyond) but also with higher gains (e.g., larger than 21 dB). Teachings according to the present disclosure describe methods and apparatuses for controlling gain of a single stage cascode FET amplifier, including provision for higher gains at higher frequencies of operation without drawbacks of the prior art implementations.

SUMMARY

According to a first aspect of the present disclosure, an amplifier circuit is presented, the amplifier circuit comprising: an input transistor and an output transistor arranged according to single stage cascode amplifier coupled between a supply voltage and a reference ground, the input transistor and the output transistor being field-effect transistors (FETs); and a capacitor and a resistor in series connection between a gate of the output transistor and the reference ground; wherein the amplifier circuit is configured to operate over a frequency range of operation, and over the frequency range of operation, the capacitor is a short, and a value of the resistor is configured to provide a gain boost of the amplifier circuit.

According to second aspect of the present disclosure, a method for boosting a gain of a low noise amplifier (LNA) is presented, the method comprising: providing a single stage cascode field-effect (FET) amplifier comprising an input transistor and a cascode output transistor; coupling a capacitor and a resistor in series connection between a gate of the output transistor and a reference ground; based on the coupling, driving a source impedance of the output transistor to become inductive; based on the driving, generating a resonance between a capacitive impedance at a drain of the input transistor and the inductive source impedance of the output transistor at a frequency of operation of the LNA; and based on the generating, boosting the gain of the LNA at the frequency of operation.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

The present disclosure describes electrical circuits in electronic devices (e.g., cell phones, radios, base stations, etc.) having a plurality of devices, such as for example, transistors (e.g., MOSFETs). Persons skilled in the art will appreciate that such electrical circuits comprising transistors can be arranged as amplifiers, and may be used, for example, in RF communication systems.

As Used Herein, the Expression "a Frequency of Operation" or "Operating Frequency" can Refer to a Frequency of the RF Signal, $RF_{IN}$, Input to a Device (Such as the Amplifier 100A).

As used herein, the expression "center frequency" can refer to a reference frequency about which the operating frequency varies. The center frequency may be, for example, associated to a band or channel of operation of an RF communication system, and the operating frequency may be associated to a bandwidth of the band or channel of operation.

The present teachings overcome prior art shortcoming by coupling a gain boosting resistor (e.g., Rb of FIG. 2A) to a gate of a cascode transistor (e.g., M2 of FIG. 2A) of a single stage cascode FET amplifier. Accordingly, such gain boosting resistor is in series connection with a gate capacitor (e.g., Cg of FIG. 2A) coupled to the gate of the cascode transistor. Similar to the prior art configuration of FIG. 1A, the gate capacitor is sized to provide a short at frequencies of operation of the amplifier.

Figure 1A:
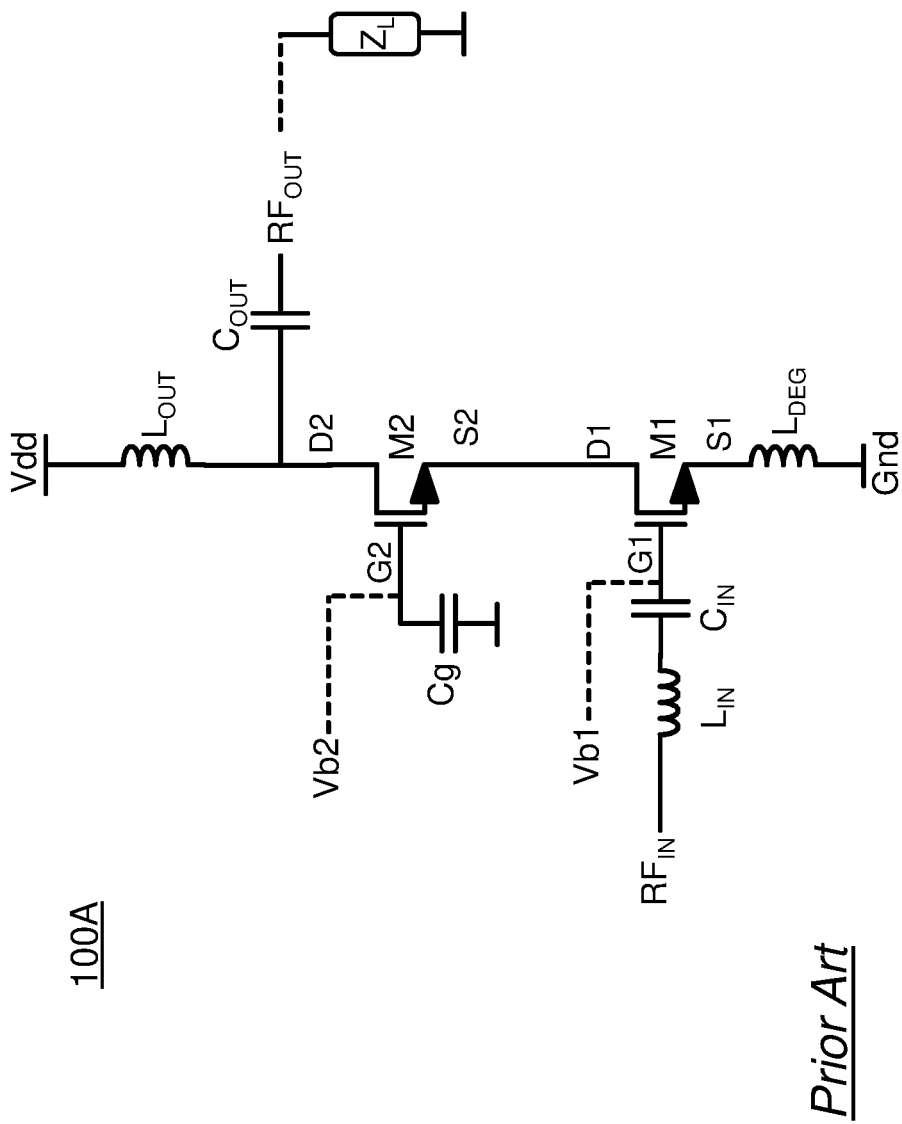
FIG. 1A shows a simplified schematic of a prior art single stage cascode FET amplifier.
Figure 1B:
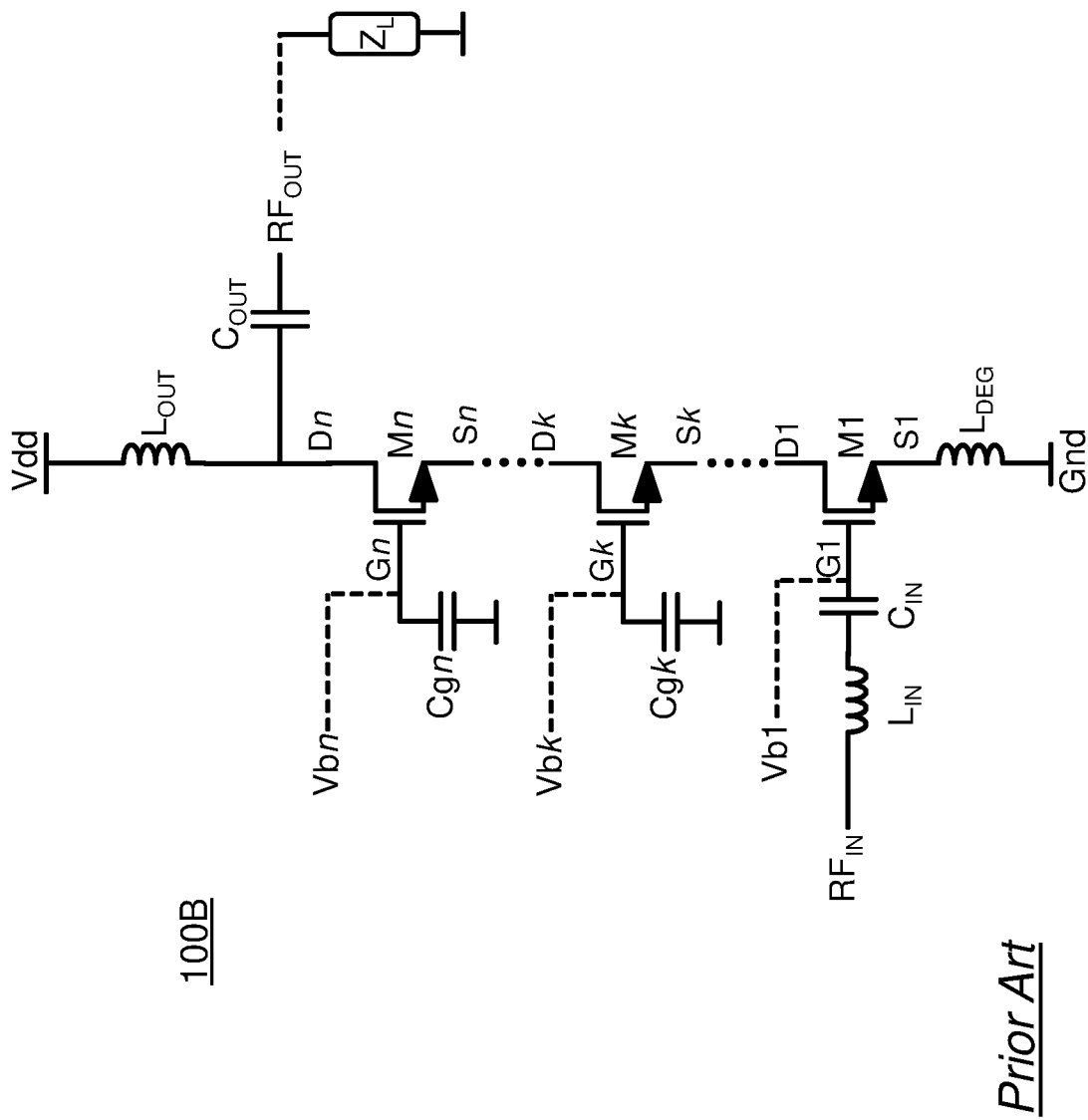
FIG. 1B shows a simplified schematic of a prior art multi-stage cascode FET amplifier for provision of higher gain.
Figure 2A:
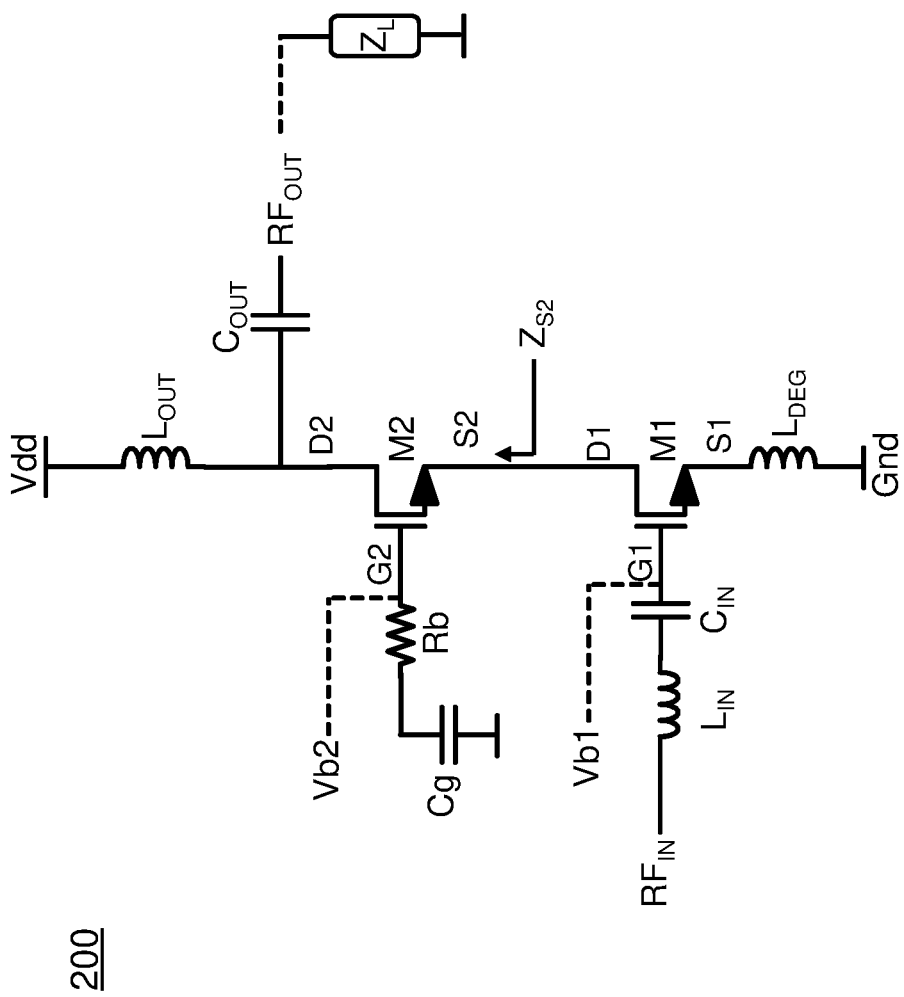
FIG. 2A shows a simplified schematic of a single stage cascode FET amplifier according to an embodiment of the present disclosure, including a gain boosting resistor coupled to a gate of the cascode stage.
Figure 3A:
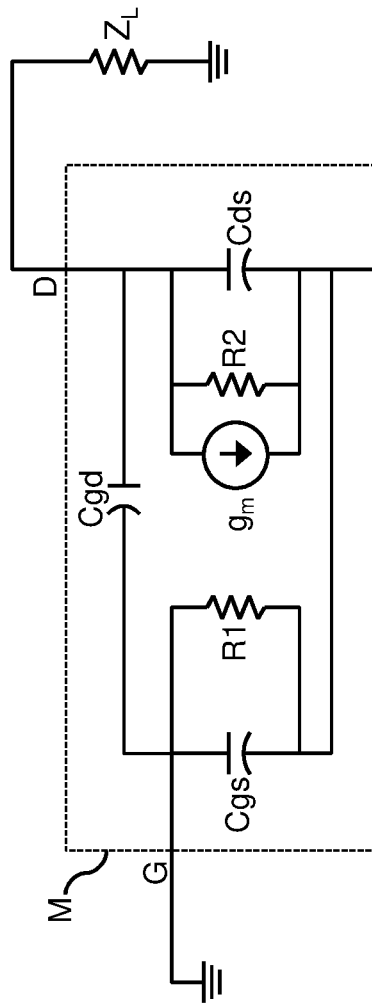
FIG. 3A shows a small signal equivalent circuit of a common gate FET transistor having a gate that is grounded.
Figure 3B:
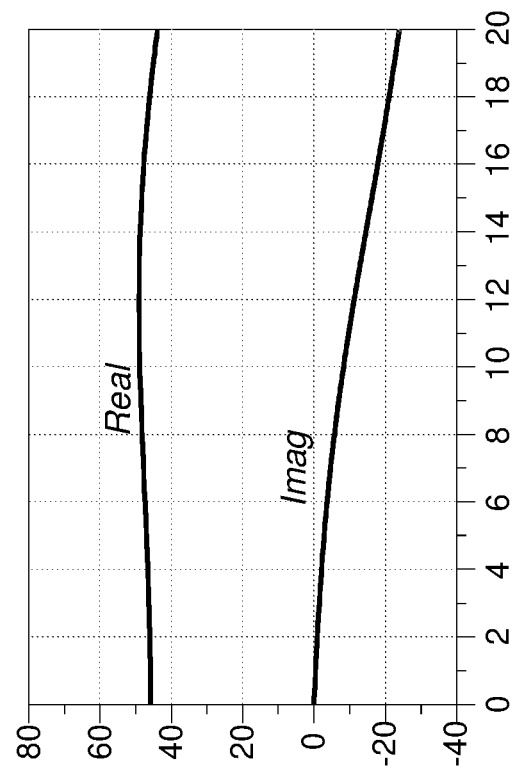
FIG. 3B shows graphs representative of real and imaginary parts of an input source impedance of the configuration shown in FIG. 3A as a function of frequency.
Figure 6A:
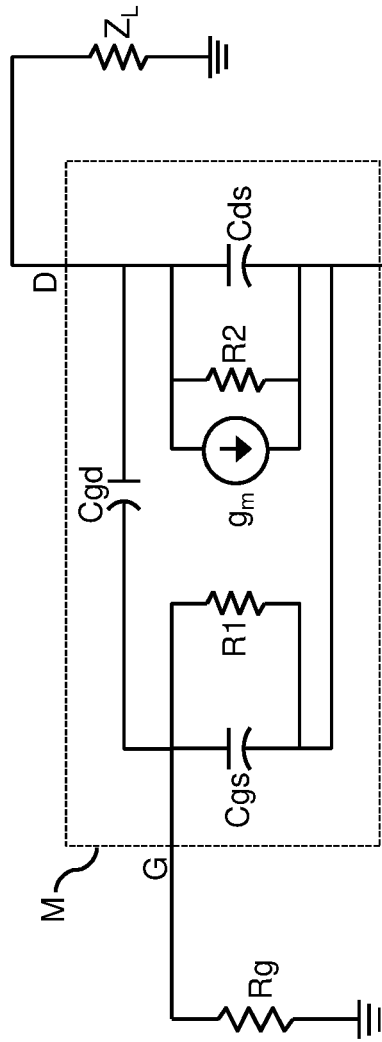
FIG. 6A shows a small signal equivalent circuit of a FET transistor having a gate that is coupled to ground through a resistor according to an embodiment of the present disclosure.
Figure 6B:
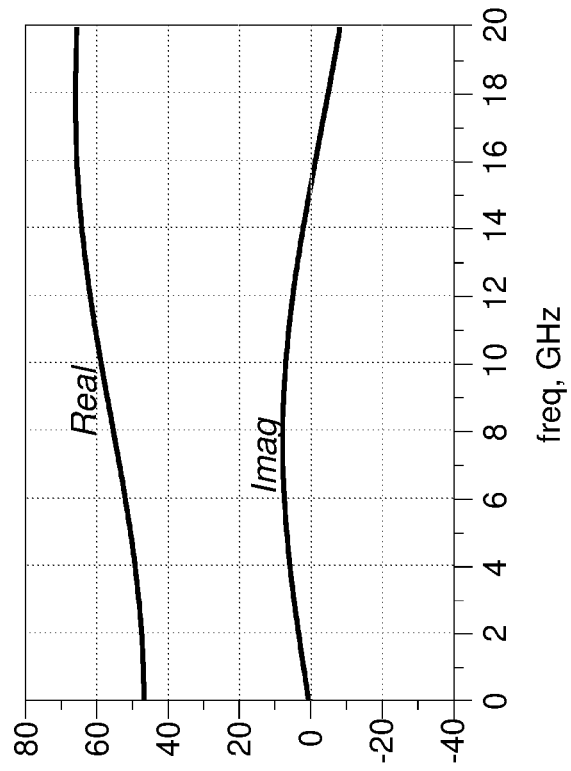
FIG. 6B shows graphs representative of real and imaginary parts of an input source impedance of the configuration shown in FIG. 6A as a function of frequency.

As later described with reference to FIGS. 6A and 6B, the gain boosting resistor (e.g., Rb of FIG. 2A) transforms an impedance looking into the source (e.g., S2 of FIG. 2A) of the cascode transistor from capacitive (e.g., per prior art configuration of FIG. 1A, with imaginary component of the impedance being negative as shown in FIG. 3B later described) to inductive (imaginary component of the impedance being positive as shown in FIG. 6B later described). On the other hand, since an output impedance (at a drain D1) of the input transistor (e.g., M1 of FIG. 2A) is capacitive, a resonance effect may be obtained through coupling of the drain (D1) of the input transistor (M1) to the source (S2) of the cascode transistor (M2). In turn, as clearly understood by a person skilled in the art, such resonance can increase/boost gain of the amplifier according to the present teachings.

Furthermore, increasing a value of the gain boosting resistor (e.g., Rb of FIG. 2A) from zero Ohm to higher values, may correspondingly increase the inductance that is coupled to the capacitive output impedance of the input transistor (e.g., M1 of FIG. 2A), which in turn can gradually/increasingly approach resonance, and therefore peak gain of the amplifier according to the present teachings. As will be described later with respect to, for example, FIGS. 2B and 7B, such increase in gain of the amplifier may be substantially linear as a function of increasing value of the gain boosting resistor. According to an exemplary embodiment of the present disclosure, such linear function may be in a range of gain boosting resistor values from 0 Ohm to about 30 Ohms. Other range of values may be obtained for different characteristics (internal elements/parameters) of the FET transistors used in the amplifier. As used herein, the term "about" when referenced to a specific (e.g., resistance, frequency) value may imply any value within a range of +/−10% of the specific value.

The gain boosting resistor according to the present teachings can accordingly provide higher gain (e.g., greater than 24 dB, such as, for example, 24.2 dB, per FIG. 7B later described) at higher frequencies of operation, including in a range from 4 GHz to 5 GHz and higher. According to some exemplary embodiment of the present disclosure, the gain boosting of the present teachings can be provided with a relatively small resistor value, in a range of, for example, between 5 Ohms to 20 Ohms, to provide a gain boost of up to 2 dB at frequencies of operation in the range from 4 GHz to 5 GHz. As described later with reference to FIG. 7B, for a given frequency of operation, a linear response of the gain of the amplifier according to present teachings with respect to varying values of the gain boosting resistor can be provided within a range of resistor values between, for example, zero Ohm and 30 Ohms, or any range of values there between, including, for example, 5 Ohms to 20 Ohms, or 5 Ohms to 25 Ohms, or 5 Ohms to 30 Ohms.

As later described with reference to FIG. 2C, such higher gain at higher frequencies of operation may not substantially degrade noise figure (NF) of the amplifier. In other words, a slight degradation (e.g., about 0.15 dB per FIG. 2C later described) of the noise figure of the single stage cascode FET amplifier according to the present teachings as a result of the gain boosting resistor coupled to the gate of the cascode transistor, is small enough to allow usage of such amplifier in low noise amplification applications, such as, for example, as an LNA in a receive path of an RF communication system, such as a 5G system, and to provide a desired gain boosting.

According to an exemplary embodiment of the present disclosure, a slight degradation of the noise figure resulting from provision of the gain boosting resistor may be reduced via an (optional) input matching network coupled to the input of the amplifier. As later described with reference to FIG. 7A, such input matching network (e.g., 710 per FIG. 7A later described) may include an inductor coupled to ground (Gnd). According to an exemplary embodiment of the present disclosure, such input matching network can be configurable (e.g., via an adjustable inductor) to allow a different input matching for a different value of the gain boosting resistor.

FIG. 2A shows a simplified schematic of a single stage cascode FET amplifier (200) according to an embodiment of the present disclosure, including a gain boosting resistor, Rb, coupled to a gate, G2, of the cascode stage (i.e., transistor M2). As clearly understood by a person skilled in the art, the amplifier (200) may be obtained by coupling the gain boosting resistor, Rb, to the gate, G2, of the cascode transistor of the prior art amplifier (100A) described above with reference to FIG. 1A. As can be seen in FIG. 2A, the gain boosting resistor, Rb, may be arranged in series connection between the gate, G2, of the cascode transistor, M2, and the gate capacitor, Cg. In other words, one terminal of the gain boosting resistor, Rb, is connected to the gate, G2, and the other terminal of the gain boosting resistor, Rb, is connected to one terminal of the gate capacitor, Cg. Finally, the other terminal of the gate capacitor, Cg, is connected to the reference ground, Gnd. It should be noted that as clearly understood by a person skilled in the art, series connection between the resistor Rb and the capacitor Cg is electrically symmetrical, and therefore, teachings according to the present disclosure equally apply for a configuration wherein an order of the series connected resistor and capacitor (Rb, Cg) is reversed (i.e., Cg connected to G2 and Rb connected to Gnd) compared to one showed in FIG. 2A.

As shown in the single stage cascode FET amplifier (200) of FIG. 2A, the present teachings overcome prior art shortcoming by coupling a gain boosting resistor, Rb, to the gate, G2, of the cascode transistor, M2, thereby controlling an imaginary part (reactance) of the source impedance, $Z_{S2}$, looking into the source of the cascode transistor, M2. As will be described later with respect to FIGS. 6A and 6B, such control of the imaginary part of the source impedance, $Z_{S2}$, includes driving the imaginary part form negative (capacitive) for a case where no resistor is present (e.g., Rb=0 Ohm), to positive (inductive) when the resistor is present (e.g., Rb>0 Ohm). In turn, as described above, the inductive source impedance, $Z_{S2}$, coupled to the capacitive output impedance of the input transistor, M1, are driven into resonance, at a frequency of operation, thereby increasing/boosting gain of the amplifier (200).

Figure 2B:
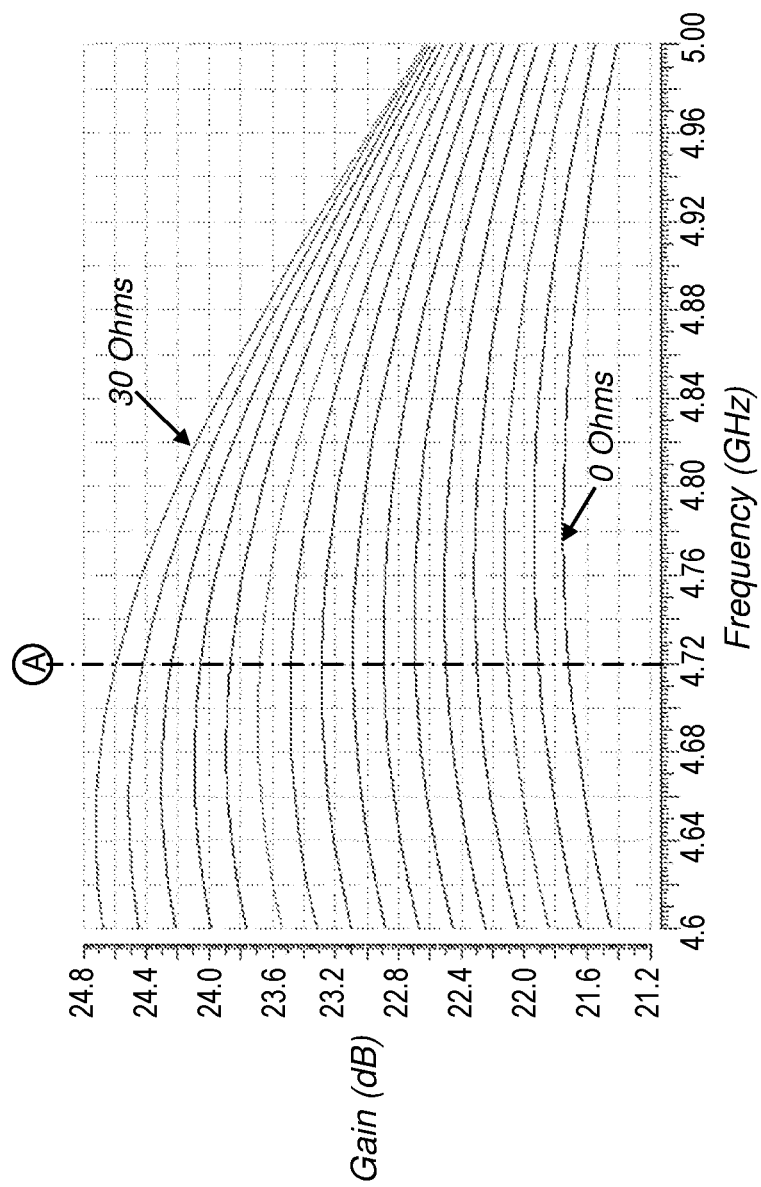
FIG. 2B shows graphs representative of a gain of the amplifier of FIG. 2A for different values of the gain boosting resistor as a function of frequency.
Figure 2C:
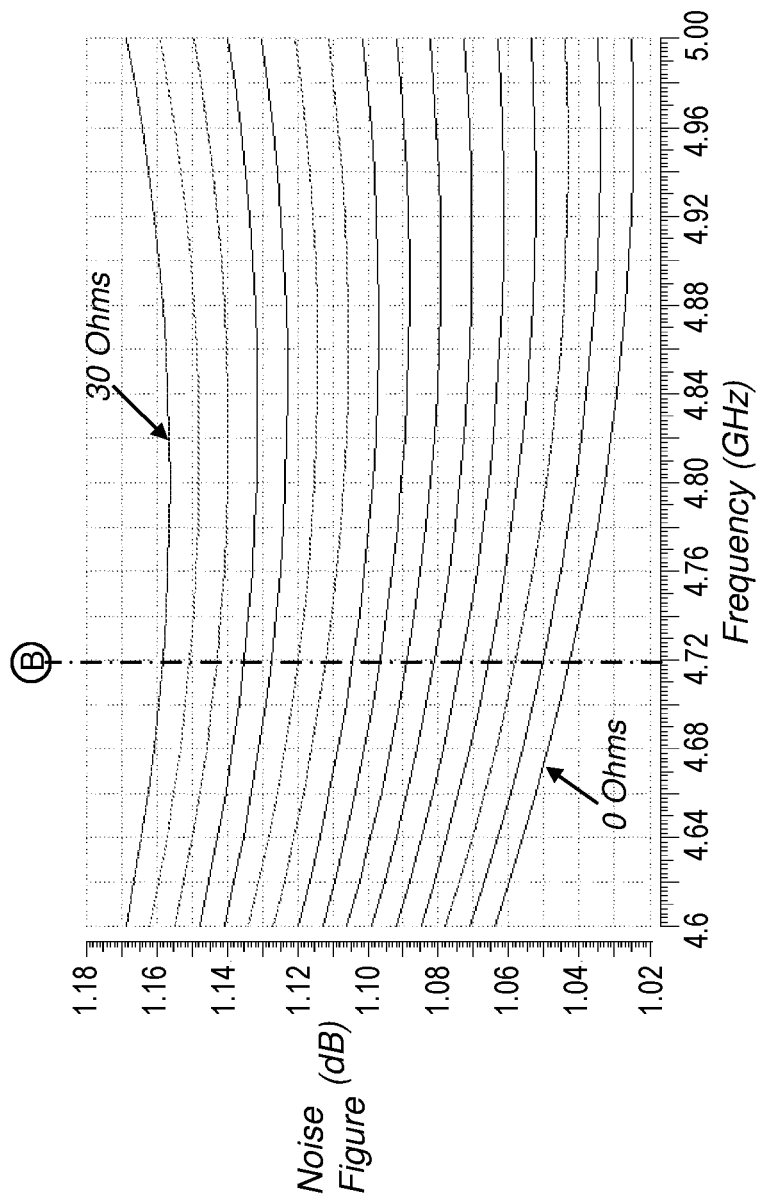
FIG. 2C shows graphs representative of a noise figure of the amplifier of FIG. 2A for different values of the gain boosting resistor as a function of frequency.

FIG. 2B shows graphs representative of a gain of the amplifier (200) of FIG. 2A for different values of the gain boosting resistor, Rb, as a function of frequency. As can be seen in such graphs, for a given value of a frequency (of operation) in an exemplary range from 4.6 GHz to 5.0 GHz, the gain increases as a function of increasing values of the gain boosting resistor, Rb, from 0 Ohm to 30 Ohms. For example, considering a frequency of operation of 4.72 GHz, which in indicated in FIG. 2B by a line A, a gain of about 21.7 dB is provided for Rb=0 Ohm, and a gain of about 24.6 dB is provided for Rb=30 Ohms, which therefore represents a gain boost of about 2.9 dB. A person skilled in the art would appreciate such boost in gain provided by the present teachings without substantial degradation in the noise figure of the amplifier (200). This can be seen in FIG. 2C, where for the same frequency of operation of 4.72 GHz, indicated in FIG. 2C by a line B, a slight increase of the noise figure of about 0.11 dB is observed. As described above and further covered with reference to FIG. 7A later described, input matching to the amplifier (200) may be used/adjusted to further reduce the amount of increase in the noise figure for a given value of the gain boosting resistor, Rb. It should be noted that the graphs shown in FIGS. 2B and 2C represent simulation results of the single stage cascode FET amplifier (200) based on a non limiting 0.13 μm bulk CMOS fabrication process.

As can be clearly taken from the above description, performance of the single stage cascode FET amplifier (e.g., 200 of FIG. 2A) according to the present disclosure can be evaluated with respect to the ability of the boosting resistor, Rb, to affect/control an imaginary part of the source impedance (e.g., $Z_{S2}$ of FIG. 2A) looking into the source of the cascode FET transistor (e.g., M2 of FIG. 2A). In particular, such performance may be evaluated with respect to capacity to drive the imaginary part of the source impedance to positive (inductive), and eventually to a value that is equal in absolute value to the imaginary part of the output impedance, so to provide a resonance between such inductive source impedance and the capacitive output impedance of the input transistor (e.g., M1 of FIG. 2A). Description with reference to following FIGS. 3A-6B describe such performance by considering a well known in the art small signal equivalent circuit of a FET transistor that can be the cascode transistor M2 discussed above, for different elements coupled to the gate (e.g., G2 of M2) of a single stage cascode FET amplifier.

FIG. 3A shows the small signal equivalent circuit model of a FET transistor, M, having a gate, G, that (at frequencies of operation) is grounded, or in other words, a common gate FET transistor as used in the prior art configuration of FIG. 1A. Included in the model are small signal parameters that include respective gate-to-source, gate-to-drain and drain-to-source capacitances (Cgs, Cgd, Cds), input stage resistor, R1, that is in parallel with the gate-to-source capacitance, Cgs, and output (current gain) stage resistor, R2 (also known as $Rds=1/g_{ds}$), that is in parallel with current gain (transconductance, $g_m$) and the drain-to-source capacitance, Cds. As known to a person skilled in the art, a small signal voltage across the input stage resistor, R1, controls an output current that flows through the parallel combination of the drain-to-source capacitance, Cds, and the output stage resistor, R2, the output current having a current gain provided by $g_m$.

FIG. 3B shows graphs representative of real and imaginary parts of an input source impedance, $Z_S$, of the configuration shown in FIG. 3A as a function of frequency. As can be seen in such graphs, the real part (e.g., resistive component of the impedance $Z_S$), varies within a frequency range of DC to 20 GHz while remaining bounded by a low value of about 40 (e.g., resistance of Ohms) and a high value of about 50 (e.g., resistance of 50 Ohms). On the other hand, the imaginary part of the impedance $Z_S$ varies from a value of zero at DC to about −25 at 20 GHz. The negative value of the imaginary part of $Z_S$ indicating that the reactive component of the impedance $Z_S$ is capacitive. It should be noted that such graphs (as well as graphs in FIGS. 4B, 5B, 6B) are based on exemplary parameters of the transistor model that include ($g_m$, $g_{ds}$, Cgs, Cgd, Cds, $Z_L$)=(26.9 mS, 2.4 mS, 81.8 fF, 40.0 fF, 144 Ohm), with units according to well known in the art standards. Accordingly, no resonance effect (and therefore gain boosting) between the source impedance of the cascode stage (e.g., M2) and the (capacitive) output impedance of the input stage (e.g., M1) can be obtained with a cascode stage (e.g., M2) having a gate that is shorted at frequencies of operation.

Figure 4A:
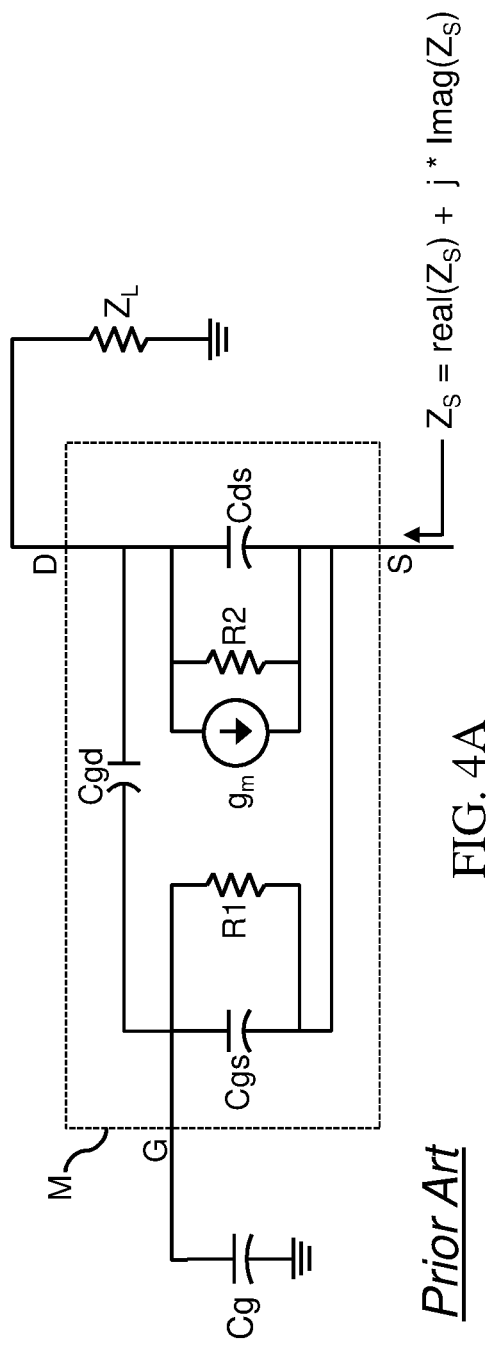
FIG. 4A shows a small signal equivalent circuit of a FET transistor having a gate that is coupled to ground through a capacitor according to a prior art configuration.

FIG. 4A shows a small signal equivalent circuit model of the FET transistor, M, described with reference to FIG. 3A, having the gate, G, that (at frequencies of operation) is coupled to ground through a capacitor, Cg. As can be seen in the corresponding graphs of FIG. 4B, a size (capacitance) of such gate capacitor can allow control of the real part (resistive) of the source impedance, $Z_S$, such as, for example, affect distribution of RF voltage at the output of the amplifier across all of the (stacked) transistors of the amplifier. As described above, such method is used in prior art multi-stage cascode configurations used in power amplifier applications. As is well known to a person skilled in the art, the size of the capacitor, Cg, can be obtained by plugging parameter values of the transistor model, load impedance, $Z_L$, and desired source impedance, $Z_S$, into the following known in the art formula:

$$C_g = \frac{(Z_L - Z_S)(C_{gd} + C_{gs})g_{ds} + C_{gd} + C_{gs} + (Z_L - Z_S)g_m C_{gd}}{(Z_S - Z_L)g_{ds} + Z_S g_m - 1}$$

Figure 4B:
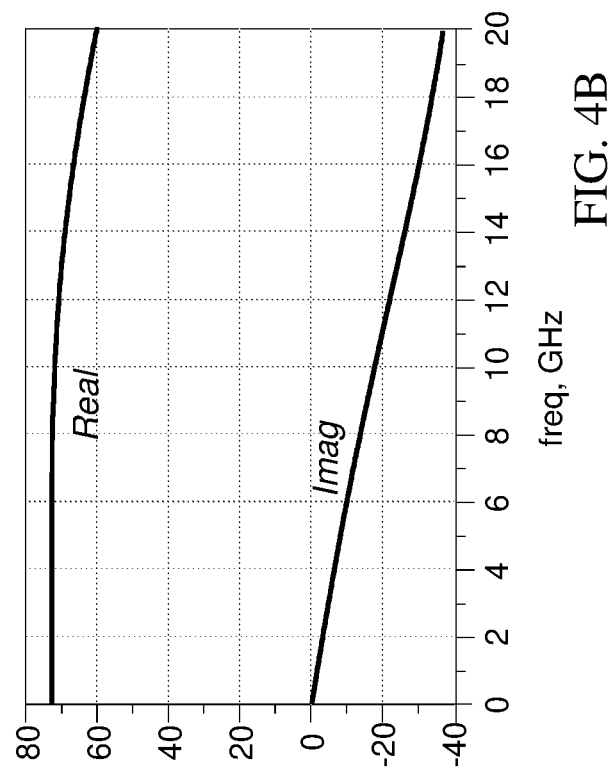
FIG. 4B shows graphs representative of real and imaginary parts of an input source impedance of the configuration shown in FIG. 4A as a function of frequency.

As can be seen in FIG. 4B, addition of the gate capacitor, Cg, may allow control of the real part of the source impedance, $Z_S$, (e.g., from DC to about 7 GHz), to provide a desired value of the real part (e.g., about 72 in the exemplary case of FIG. 4B). Furthermore, as can be clearly seen in the graph of FIG. 4B, the imaginary part of the source impedance, $Z_S$, is negative (i.e., capacitive), according to a linear function of the frequency. In other words, the source impedance, $Z_S$, includes a substantial capacitance which can cause increasing degrees (with respect to increasing frequencies) of phase shifts of current output at the drain of the transistor, M, of FIG. 4A. Accordingly, no resonance effect (and therefore gain boosting) between the source impedance of the cascode stage (e.g., M2) and the (capacitive) output impedance of the input stage (e.g., M1) can be obtained with a cascode stage (e.g., M2) having a gate that is coupled to a capacitive element (capacitor) at frequencies of operation.

Figure 5A:
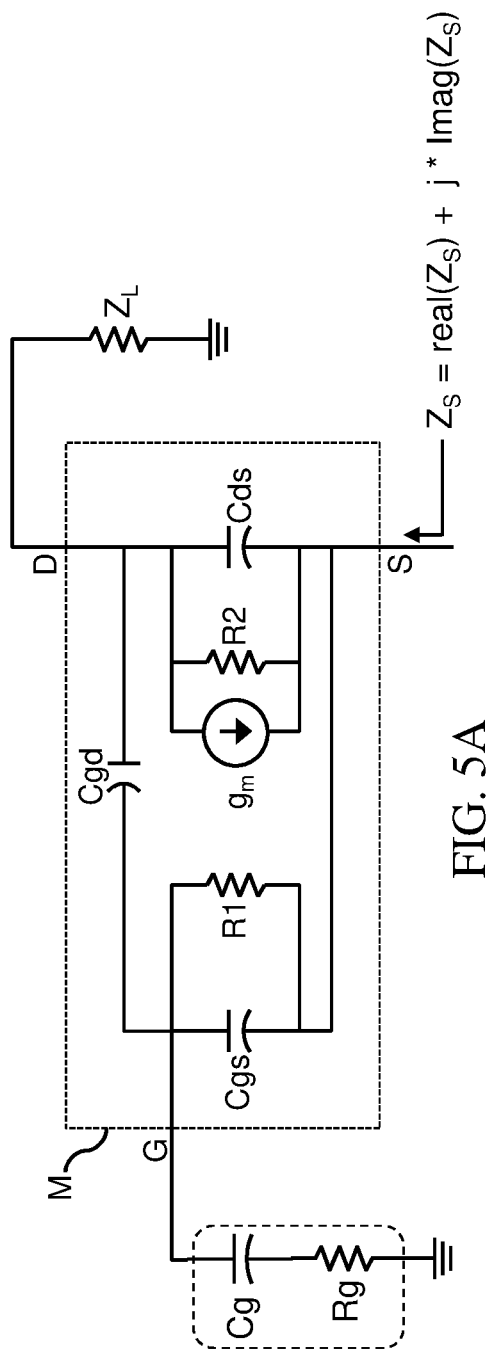
FIG. 5A shows a small signal equivalent circuit of a FET transistor having a gate that is coupled to ground through a series connected capacitor and resistor according to an embodiment of the present disclosure.

FIG. 5A shows the small signal equivalent circuit of the FET transistor, M, of FIG. 3A, having a gate that (at frequencies of operation) is coupled to ground through a series-connected capacitor, Cg, and resistor, Rg. As can be seen in the corresponding graphs of FIG. 5B, and similar to the prior art configuration described above with reference to FIGS. 4A and 4B, values of the capacitor, Cg, and the resistor, Rg, of the compensation network (Rg, Cg) coupled to the gate, G, of the transistor, M, can allow control of the real part (resistive) of the source impedance, $Z_S$.

Figure 5B:
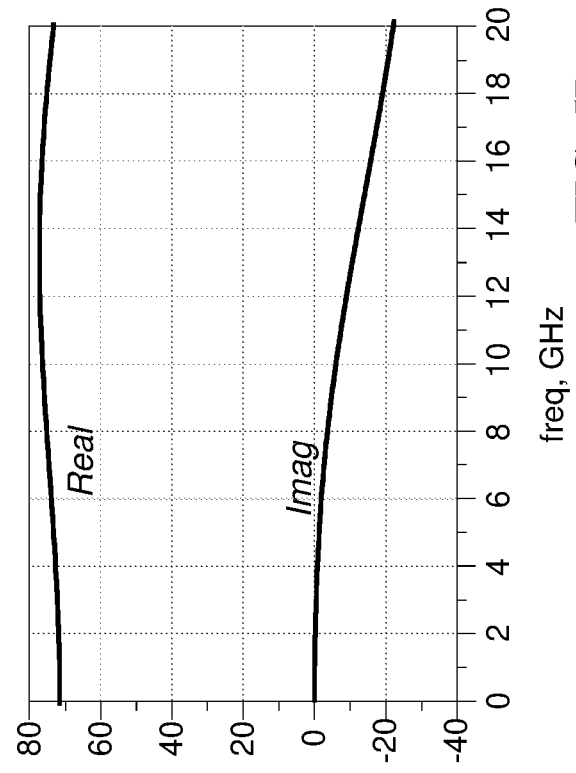
FIG. 5B shows graphs representative of real and imaginary parts of an input source impedance of the configuration shown in FIG. 5A as a function of frequency.

With continued reference to FIGS. 5A and 5B, for a given set of values of elements of the series connected network (Rg, Cg), control of the real part of the source impedance, $Z_S$, according to a desired value can be maintained over an extended range of frequencies, such as for example, DC to 20 GHZ. For example, as can be clearly taken from FIG. 5B, such real part of the source impedance, $Z_S$, is bounded by a high value of about 79, and a low value of about 72. In addition, and in stark contrast to the prior art configuration of FIG. 4A/4B, such series-connected network (Rg, Cg) can further control the imaginary part of the source impedance, $Z_S$ such as to maintain a reduced capacitive component in a frequency range from DC to about 6 GHz. In other words, although the series-connected network (Rg, Cg) may substantially cancel reactance of the source impedance, $Z_S$, over such frequency range, the reactance remains on the negative side of the graph (capacitive). Accordingly, no resonance effect (and therefore gain boosting) between the source impedance of the cascode stage (e.g., M2) and the (capacitive) output impedance of the input stage (e.g., M1) can be obtained with a cascode stage (e.g., M2) having a gate that is coupled to ground through the series-connected network shown in FIG. 5A.

FIG. 6A shows the small signal equivalent circuit of the FET transistor, M, of FIG. 3A, having a gate that (at frequencies of operation) is coupled to ground through a resistor, Rg (e.g., gain boosting resistor Rb of FIG. 2A, exemplary value of about 30 Ohms). As can be seen in the corresponding graphs of FIG. 6B, within a range of the frequency spectrum, from DC to about 15 GHz, the gate resistor, Rg, drives the imaginary part of the source impedance, $Z_S$, positive, which therefore corresponds to an inductive impedance. As described above, such inductive impedance may resonate with the (capacitive) output impedance of the input stage (e.g., M1) to provide the gain boosting according to the present teachings. It should be noted that, as clearly understood by a person skilled in the art, because the gate capacitor, Cg, of the amplifier configuration (200) according to the present teachings shown in FIG. 2A, is a short at frequencies of operation, the equivalent small signal model of the cascode transistor, M2, can be represented by FIG. 6A.

Figure 7A:
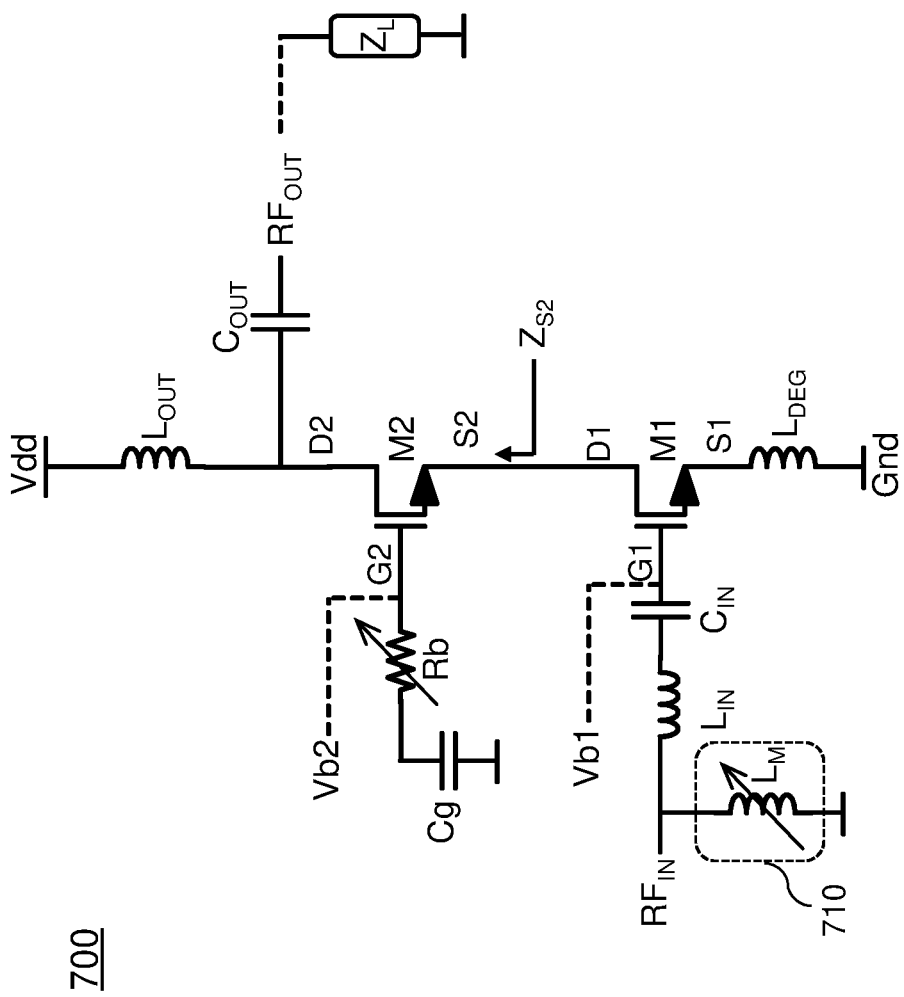
FIG. 7A shows a simplified schematic of a single stage cascode FET amplifier according to an embodiment of the present disclosure, including a variable gain boosting resistor coupled to a gate of the cascode stage.

FIG. 7A shows a simplified schematic of a single stage cascode FET amplifier (700) according to an embodiment of the present disclosure, including a variable gain boosting resistor, Rb, coupled to a gate, G2, of the cascode stage, M2. Such configuration can be used to control the gain/boost provided by the resistor, Rb, according to, for example, conditions of operation of the amplifier (700), such as, for example, based on a frequency of operation, a mode of operation, amplitude of the $RF_{IN}$ signal, communication channel characteristics, or other. Control of the variable gain boosting resistor may be performed by, for example, a signal aware processor, such as, for example, a transceiver module of an RF communication system, according to characteristics of the input signal. The variable gain boosting resistor, Rb, may be according to any known in the art resistor design that can provide variable/adjustable/configurable values of a resistance, whether stepwise or continuous.

With continued reference to the amplifier (700) of FIG. 7A, according to an exemplary embodiment of the present disclosure, a slight degradation of the noise figure resulting from provision of the gain boosting resistor, Rb, may be reduced via an (optional) input matching network (710) coupled to the input of the amplifier (700). In particular, as shown in FIG. 7A, such input matching network (710) may be coupled at a terminal of the input inductor, $L_{IN}$, that is away from the capacitor, $C_{IN}$. According to an exemplary embodiment of the present disclosure, and as shown in FIG. 7A, such input matching network (710) may include an inductor, $L_M$, coupled to ground (Gnd). According to a further exemplary embodiment of the present disclosure, the input matching network (710) can be configurable (e.g., adjustable inductor $L_M$) to allow a different input matching for a different value of the gain boosting resistor, Rb. Control of elements (e.g., adjustment/configuring of inductor, $L_M$) of the input matching network (710) may be according to the same scheme that controls the variable gain boosting resistor, Rb, described above. It should be noted that a person skilled in the art is well aware of different configurations possible for the input matching network (710) beyond use of a single shunted inductor (e.g., $L_M$) shown in FIG. 7A, including configurations with combination of capacitive and inductive elements.

Figure 7B:
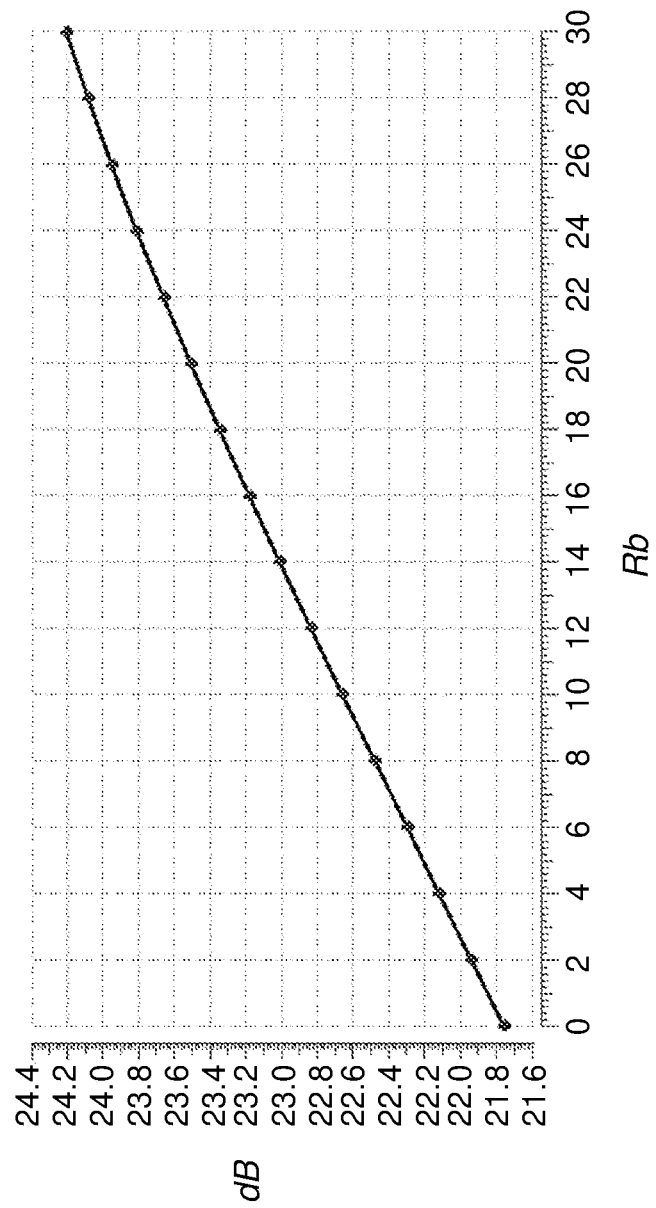
FIG. 7B shows a graph representative of a gain of the amplifier of FIG. 7A for varying values of the variable gain boosting resistor.

FIG. 7B shows a graph representative of a gain (in dB) of the amplifier (700) of FIG. 7A for varying values of the variable gain boosting resistor, Rb, at an exemplary operating frequency of 4.7 GHz. As can be seen in the graph of FIG. 7B, the gain of the amplifier (700) is (substantially) linear as a function of increasing value of the variable gain boosting resistor, Rb. According to an exemplary embodiment of the present disclosure, such linear function may be provided in a range of gain boosting resistor values that vary from 0 Ohm to 30 Ohms. Other range of values may be obtained for different characteristics (internal elements/parameters) of the FET transistors (M1, M2) used in the amplifier (700).

With reference back to the configuration shown in FIG. 7A, according to an embodiment of the present disclosure, the variable gain boosting resistor, Rb, may be used as means to calibrate/adjust amplifier gain during a manufacturing and/or calibration phase of the amplifier (700). As known to a person skilled in the art, such calibrating/adjusting may be to cancel effects of process variation on gain of the amplifier (700). Accordingly, an entire batch/production of amplifiers (700) may be calibrated/adjusted to have a (substantially) same gain at a frequency of operation. Furthermore, by making the variable gain boosting resistor, Rb, fusable (e.g., lockable, fixable), the calibrated/adjusted gain can be maintained during operation of the amplifiers (700).

Figure 8:
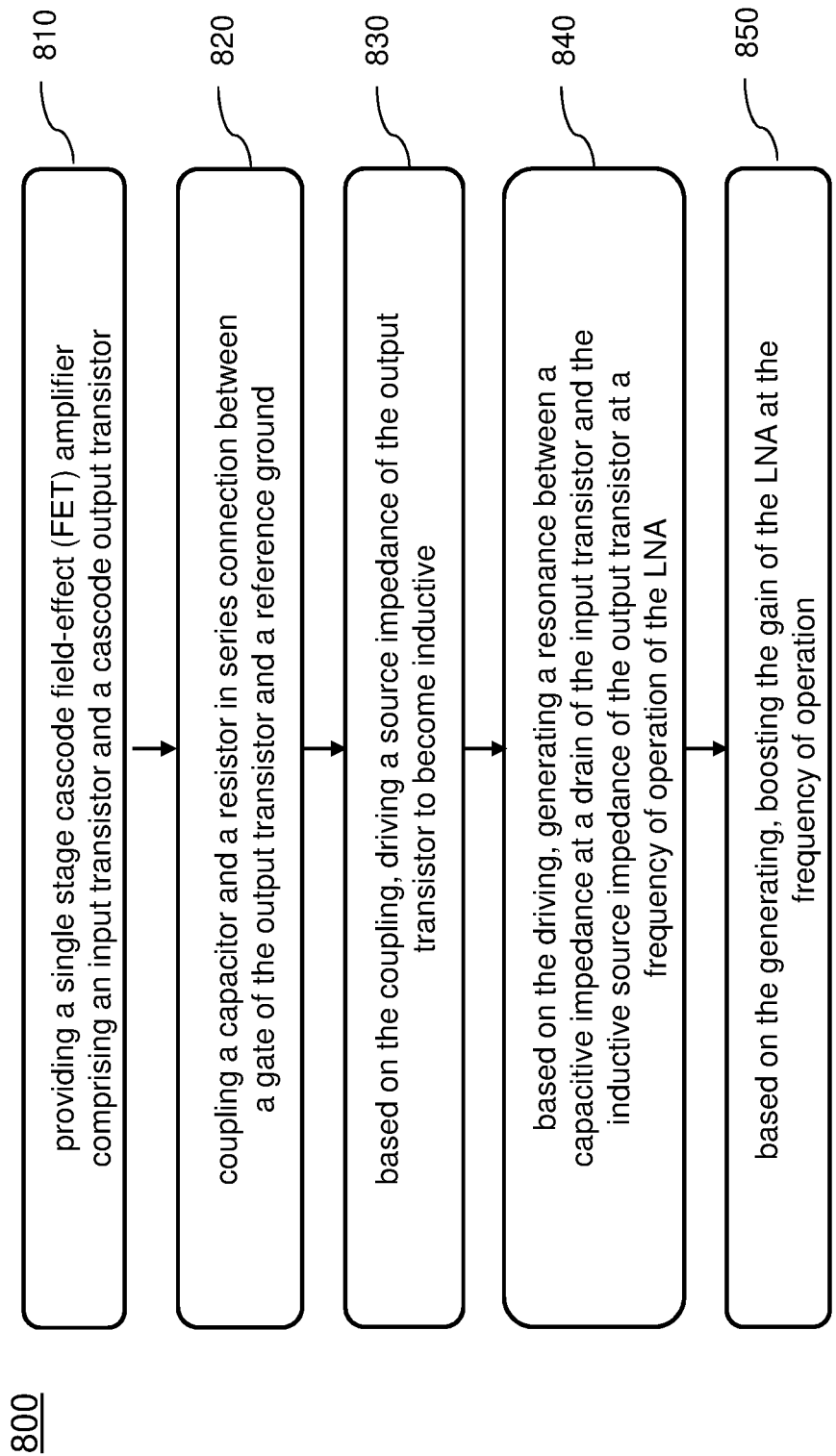
FIG. 8 is a process chart showing various steps of a method for boosting a gain of a low noise amplifier (LNA)

FIG. 8 is a process chart (800) showing various steps of a method for boosting a gain of a low noise amplifier (LNA). As can be seen in FIG. 8, such steps comprise: providing a single stage cascode field-effect (FET) amplifier comprising an input transistor and a cascode output transistor, per step (810); coupling a capacitor and a resistor in series connection between a gate of the output transistor and a reference ground, per step (820); based on the coupling, driving a source impedance of the output transistor to become inductive, per step (830); based on the driving, generating a resonance between a capacitive impedance at a drain of the input transistor and the inductive source impedance of the output transistor at a frequency of operation of the LNA, per step (840); and based on the generating, boosting the gain of the LNA at the frequency of operation, per step (850).

It should be noted that the various embodiments of the single stage cascode FET amplifier with gain bosting resistor according to the present disclosure, may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "amplifier" as used in the present disclosure is intended to refer to amplifiers comprising single or stacked transistors configured as amplifiers, and can be used, for example, as power amplifiers (PAs) and/or low noise amplifiers (LNAs). An amplifier can refer to a device that is configured to amplify a signal input to the device to produce an output signal of greater magnitude than the magnitude of the input signal. Stacked transistor amplifiers are described for example in U.S. Pat. No. 7,248,120, issued on Jul. 24, 2007, entitled "Stacked Transistor Method and Apparatus", U.S. Pat. No. 7,123,898, issued on Oct. 17, 2006, entitled "Switch Circuit and Method of Switching Radio Frequency Signals", U.S. Pat. No. 7,890,891, issued on Feb. 15, 2011, entitled "Method and Apparatus Improving Gate Oxide Reliability by Controlling Accumulated Charge", and U.S. Pat. No. 8,742,502, issued on Jun. 3, 2014, entitled "Method and Apparatus for use in Improving Linearity of MOSFETs Using an Accumulated Charge Sink—Harmonic Wrinkle Reduction", the disclosures of which are incorporated herein by reference in their entirety. As used herein, the term "amplifier" can also be applicable to amplifier modules and/or power amplifier modules having any number of stages (e.g., pre-driver, driver, final), as known to those skilled in the art.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments according to the present disclosure have been described. It is to be understood that various modifications may be made without departing from the spirit and scope of such embodiments. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the disclosure, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. An amplifier circuit, comprising:
an input transistor in series connection with an output transistor; and
a series connected capacitor and resistor comprising a capacitor in series connection with a resistor having a variable resistance,
wherein
the series connected capacitor and resistor is coupled between a gate of the output transistor and a reference ground, and is configured to produce an inductive impedance at a source of the output transistor,
the variable resistance is configured to vary the inductive impedance at the source of the output transistor, and
a gain of the amplifier circuit is linearly varied by varying the inductive impedance.

2. The amplifier circuit according to claim 1, wherein the inductive impedance at the source of the output transistor is coupled to a capacitive impedance provided at a drain of the input transistor.

3. The amplifier circuit according to claim 1, wherein:
an increase of the variable resistance provides an increase of the inductive impedance, and
the increase of the inductive impedance increases the gain of the amplifier circuit.

4. The amplifier circuit according to claim 1, wherein:
an increase of the variable resistance provides an increase of the inductive impedance, and
the increase of the inductive impedance causes a coupling between the inductive impedance and a capacitive impedance provided at a drain of the input transistor to increasingly approach resonance.

5. The amplifier circuit according to claim 4, wherein the gain of the amplifier circuit increases as the coupling between the inductive impedance and the capacitive impedance increasingly approach resonance.

6. The amplifier circuit according to claim 1, wherein a peak of the gain of the amplifier circuit is provided by a resonance between the inductive impedance at the source of the output transistor and a capacitive impedance provided at a drain of the input transistor.

7. The amplifier circuit according to claim 1, wherein a value of the variable resistance is selected for calibration of the gain of the amplifier circuit.

8. The amplifier circuit according to claim 7, wherein the resistor is a fusable resistor that allows locking of the variable resistance to the value selected for the calibration of the gain of the amplifier circuit.

9. The amplifier circuit according to claim 1, wherein a frequency range of operation of the amplifier circuit is from about 4 GHz to about 5 GHz.

10. The amplifier circuit according to claim 1, wherein a frequency range of operation of the amplifier circuit is from DC to about 15 GHz.

11. The amplifier circuit according to claim 1, wherein a value of the variable resistance is in a range from about 5 Ohms to about 20 Ohms.

12. The amplifier circuit according to claim 1, wherein a value of the variable resistance is in a range from about 5 Ohms to about 30 Ohms.

13. The amplifier circuit according to claim 1, wherein the amplifier circuit is configured to operate as a low noise amplifier.

14. The amplifier circuit according to claim 13, further comprising:
a degeneration inductor coupled between a source of the input transistor and the reference ground.

15. The amplifier circuit according to claim 14, further comprising:
an input inductor coupled to a gate of the input transistor.

16. The amplifier circuit according to claim 15, further comprising:
an input matching network coupled to the input inductor.

17. The amplifier circuit according to claim 1, further comprising:
a configurable input matching network coupled to a gate of the input transistor.

18. The amplifier circuit according to claim 1, wherein the variable resistance varies in a range from about 5 Ohms to about 20 Ohms.

19. A communication system for communication over a plurality of frequency bands, the communication system comprising the amplifier circuit of claim 1.

20. The communication system of claim 19, wherein the plurality of frequency bands span over a frequency range from about 4 GHz to about 5 GHz.

21. A method for varying a gain of an amplifier, comprising:
providing a series connected capacitor and resistor comprising a capacitor is series connection with a resistor having a variable resistance;
coupling the series connected capacitor and resistor between a gate of a first transistor of the amplifier and a reference ground, thereby producing an inductive impedance at a source of the first transistor;
coupling a drain of a second transistor of the amplifier to the source of the first transistor;
varying the variable resistance, thereby varying the inductive impedance; and
linearly varying the gain of the amplifier based on the varying of the inductive impedance.

22. The method according to claim 21, wherein:
the first transistor is an output transistor of the amplifier, and
the second transistor is an input transistor of the amplifier.

23. The method according to claim 21, further comprising:
increasing the variable resistance, thereby increasing the inductive impedance; and
based on the increasing of the inductive impedance, causing a coupling between the inductive impedance and a capacitive impedance provided at the drain of the second transistor to increasingly approach resonance.

24. The method according to claim 23, further comprising:
increasing the gain of the amplifier based on the increasingly approach of the resonance.

* * * * *